United States Patent
Hashidzume et al.

(10) Patent No.: US 6,538,937 B2
(45) Date of Patent: Mar. 25, 2003

(54) NONVOLATILE SEMICONDUCTOR MEMORY TEST CIRCUIT AND METHOD, NONVOLATILE SEMICONDUCTOR MEMORY AND METHOD FOR FABRICATING NONVOLATILE SEMICONDUCTOR MEMORY

(75) Inventors: Takahiko Hashidzume, Osaka (JP); Yoshinori Odake, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/930,968

(22) Filed: Aug. 17, 2001

(65) Prior Publication Data
US 2002/0024862 A1 Feb. 28, 2002

(30) Foreign Application Priority Data
Aug. 23, 2000  (JP) .......................... 2000-252209

(51) Int. Cl.⁷ .............................. G11C 7/00; G11C 16/04
(52) U.S. Cl. .................... 365/201; 365/185.01
(58) Field of Search ............................ 365/201, 185.01, 365/185.24, 185.05, 185.09, 185.17

(56) References Cited

U.S. PATENT DOCUMENTS

| 5,155,701 | A | * | 10/1992 | Komori et al. | ........ 365/185.04 |
| 5,636,168 | A | * | 6/1997 | Oyama | ........ 365/185.3 |
| 5,912,836 | A | | 6/1999 | Liu et al. | ........ 365/185.01 |
| 6,128,219 | A | * | 10/2000 | Pio et al. | ........ 365/185.05 |

FOREIGN PATENT DOCUMENTS

JP            11-177072            7/1999

* cited by examiner

*Primary Examiner*—Richard Elms
*Assistant Examiner*—Anh Phung
(74) *Attorney, Agent, or Firm*—Nixon Peabody LLP; Thomas W. Cole

(57) ABSTRACT

A circuit for testing a nonvolatile semiconductor memory includes a serial connection of flash memory cells as a first memory group. In the serial connection, the gates of the flash memory cells have been connected to each other, and a first one of the cells has its source or drain connected to the source or drain of a second one of the cells when the first and second cells are adjacent to each other.

14 Claims, 8 Drawing Sheets

NONVOLATILE SEMICONDUCTOR MEMORY TEST CIRCUIT AND METHOD, NONVOLATILE SEMICONDUCTOR MEMORY AND METHOD FOR FABRICATING NONVOLATILE SEMICONDUCTOR MEMORY

BACKGROUND OF THE INVENTION

The present invention relates to a circuit and method for testing a nonvolatile semiconductor memory (especially, flash EEPROM), a nonvolatile semiconductor memory including the test circuit and a method for fabricating a memory of that type.

A nonvolatile semiconductor memory (e.g., flash memory) is a device for retaining particular data thereon for a long period, and included in various consumer electronic appliances like cell phones and personal computers, necessary for our daily life. Since a nonvolatile memory is used for a long time, e.g., for ten years, a reliability test has to be carried out thereon to check its data retainability. Actually, though, it is difficult to carry out a reliability test over such a long time. Thus, it is important to develop a circuit and method for evaluating the reliability of a nonvolatile semiconductor memory more easily and more accurately in a shorter time.

Particularly in recent years, a nonvolatile semiconductor memory with a greater storage capacity has been in demand and the test time required has been on the rise disadvantageously. Therefore, the reliability evaluating method should be further improved. Normally, a reliability tester is directly mounted on a wafer where devices under test are disposed, which makes it easier to measure any characteristic of interest.

Examples of the characteristics measured in a reliability test include the threshold voltage of a flash memory cell. The threshold voltage of a flash memory cell is controlled by a quantity of charge existing in the floating gate of the cell, and is a function directly determined by the quantity of charge stored on the particular cell. Thus, the threshold voltage is generally considered the most important parameter determining the state of data stored on a memory cell.

A cell in a memory array may unintentionally gain or lose charge during its operation. This unintentional charge gain or loss may alter the state of data stored on the cell and might deteriorate the resultant device performance. Moreover, any variation occurring during the fabrication process of a memory array, e.g., the size or thickness of the floating gate, thickness of the gate oxide film, and source/drain structure, may change the charge retention characteristic of the floating gate in one of multiple cells included in the memory array. In that case, the device performance may also deteriorate.

However, in evaluating the reliability of an actual large-scale memory, a huge number of cells included in the memory each have to be tested, thus requiring a tremendously long test time and an amazingly high cost. For that reason, a tester, which can accurately control the charge distribution just as observed in the actual devices and yet can easily measure the resultant distribution, has been in high demand.

As an exemplary circuit of that type, a circuit for sensing the non-variable charge gain and loss of a memory cell was disclosed in Japanese Laid-Open Publication No. 11-177072. The circuit is used for estimating the threshold voltage of a given flash memory cell. The circuit includes a group of memory cells that are connected in parallel with each other as shown in FIG. 7 to estimate a deviation from a target threshold voltage. In the following description, a group of memory cells prepared for testing purposes, like that shown in FIG. 7, will be referred to as a "test memory group" or simply "memory group".

The memory group shown in FIG. 7 consists of a plurality of memory cells 801, 802, 803 and 804 including common source 800A, common drain 800B and common gate 800C. The sources 801A through 804A of these cells are connected to the common source 800A. The drains 801B through 804B of the cells are connected to the common drain 800B. The gates of the cells are connected to the common gate 800C. The cells shown in FIG. 7 are connected in parallel. Accordingly, as the threshold voltage applied to the common gate 800C is gradually increased, the common source 800A and the common drain 800B will be electrically continuous to each other when one of the cells that has the lowest threshold voltage turns ON. This is to say, this parallel connection serves as a tester that reflects the characteristic of the cell with the lowest threshold voltage.

The circuit disclosed in the above-identified publication includes, on the same wafer, two types of memory groups, i.e., n- and p-channel memory groups each having the structure shown in FIG. 7. If these two types of memory groups are disposed in this manner, it is possible to test a cell with the lowest threshold voltage in the n-channel memory group. In addition, it is also possible to estimate how much the threshold voltage of the cell has shifted from the target threshold voltage in the negative direction and how the cell loses its charge. Also, in the p-channel memory group showing a characteristic opposite to that of the n-channel memory group, it is possible to test a cell with the highest threshold voltage. And it is also possible to estimate how much the threshold voltage of the cell has shifted from the target threshold voltage in the positive direction and how the cell gains its charge.

However, the known test circuit has the following drawbacks. Specifically, an actual device is of n- or p-channel type. Therefore, either the n- or p-channel memory group of the circuit has a channel structure different from that of the actual device. Thus, a memory group with a channel structure different from that of the actual device may have to be used in testing the device. This leads to inaccurate threshold voltage estimation. For example, if the actual device has an n-channel structure, the threshold voltage thereof estimated by the p-channel memory group is different from the real threshold voltage of the n-channel device. The highest threshold voltage of a cell in the p-channel memory group does not necessarily reflect the highest threshold voltage of a cell in the n-channel memory group.

Furthermore, in evaluating the charge retention characteristic of a memory cell, the tester may be left in a special (e.g., elevated-temperature) environment in order to shorten the test time. In that case, a memory group with a channel structure different from that of an actual device shows a different characteristic, thus also decreasing the accuracy.

In addition, in a normal memory cell, electrons come and go into/out of a floating gate electrode through a tunnel gate oxide film (which will be herein referred to as a "tunnel oxide film"). An accelerated test is carried out in the special environment to finish the reliability test in a shorter time by artificially creating a state in which electrons are exchanged more easily through the tunnel oxide film. However, in the accelerated test, electrons are also likely exchanged between the floating gate electrode and a control gate electrode through a capacitive insulating film, not just through the tunnel oxide film. Should electrons be exchanged through the capacitive insulating film, the result of the accelerated test would be inaccurate. Accordingly, the accelerated test should preferably be carried out using a tester with such a structure as suppressing the exchange of electrons through the capacitive insulating film.

SUMMARY OF THE INVENTION

It is therefore an object of the present invention to provide a circuit and method for accurately evaluating the performance of a memory cell in a flash memory array.

An inventive circuit for testing a nonvolatile semiconductor memory includes a serial connection of flash memory cells as a first memory group. The gates of the flash memory cells have been connected to each other and a first one of the cells has its source or drain connected to the source or drain of a second one of the cells when the first and second cells are adjacent to each other.

In one embodiment of the present invention, the circuit may further include a parallel connection of flash memory cells as a second memory group, in which the sources of the cells have been connected together, the drains of the cells have also been connected together and the gates of the cells have also been connected together.

In this particular embodiment, the serial connection preferably further includes a current amplifier or a voltage amplifier.

In another embodiment, each of the flash memory cells in the serial connection preferably has the same structure as each of the flash memory cells in the parallel connection.

An inventive testing method is a method for testing a nonvolatile semiconductor memory using a test circuit. The method includes the step of a) preparing the test circuit, which includes a serial connection of flash memory cells and a parallel connection of flash memory cells. In the serial connection, the gates of the flash memory cells have been connected to each other and a first one of the cells has its source or drain connected to the source or drain-of a second one of the cells when the first and second cells are adjacent to each other. In the parallel connection, the sources of the cells have been connected together, the drains of the cells have also been connected together and the gates of the cells have also been connected together. The method further includes the step of b) evaluating a characteristic of one of the flash memory cells that has the highest threshold voltage in the serial connection included in the test circuit. And the method further includes the step of c) evaluating a characteristic of one of the flash memory cells that has the lowest threshold voltage in the parallel connection included in the test circuit.

In one embodiment of the present invention, the steps b) and c) may be performed at regular intervals in an environment where loss or injection of retained charges from/into each of the flash memory cells is accelerated.

Specifically, in the environment, each of the flash memory cells belonging to the serial connection may have its threshold voltage set higher than a threshold voltage of the nonvolatile semiconductor memory in an operating range thereof.

Alternatively, in the environment, each of the flash memory cells belonging to the parallel connection may have its threshold voltage set lower than a threshold voltage of the nonvolatile semiconductor memory in an operating range thereof.

As another alternative, in the environment, a voltage, accelerating the loss or injection of the retained charges, may be applied to at least one of the gate, drain, source and substrate of each of the cells belonging to the serial or parallel connection.

Also, the temperature of the environment may be set to a temperature at which the nonvolatile semiconductor memory is tested to accelerate the loss or injection of the retained charges.

An inventive nonvolatile semiconductor memory includes: a circuit for testing the nonvolatile semiconductor memory; and an array of flash memory cells. The circuit includes a serial connection of flash memory cells and a parallel connection of flash memory cells. In the serial connection, the gates of the flash memory cells have been connected to each other and a first one of the cells has its source or drain connected to the source or drain of a second one of the cells when the first and second cells are adjacent to each other. In the parallel connection, the sources of the cells have been connected together, the drains of the cells have also been connected together and the gates of the cells have also been connected together. Each of the flash memory cells in the circuit and each of the flash memory cells in the array include a tunnel insulating film, a floating gate electrode, a capacitive insulating film and a control gate electrode. The capacitive insulating film of each of the flash memory cells in the circuit is thicker than the capacitive insulating film of each of the flash memory cells in the array.

In one embodiment of the present invention, a ratio of the capacitance of the floating gate electrode to the capacitance of the tunnel insulating film in each of the flash memory cells of the array may be equal to a ratio of the capacitance of the floating gate electrode to the capacitance of the tunnel insulating film in each of the flash memory cells of the circuit.

In another embodiment, the channel region of each of the flash memory cells in the array may have the same shape as the channel region of each of the flash memory cells in the circuit.

An inventive method for fabricating a nonvolatile semiconductor memory includes the step of a) defining an isolation region in a semiconductor substrate, thereby defining first and second active regions that are electrically isolated from each other by the isolation region. The method further includes the step of b) forming a tunnel insulating film over the first and second active regions. The method further includes the step of c) forming floating gate electrodes on the tunnel insulating film. The method further includes the step of d) forming a first insulating film over the floating gate electrodes. The method further includes the step of e) selectively removing part of the first insulating film that has been formed over the first active region. The method further includes the step of f) forming a second insulating film over the floating gate electrode in the first active region and over the first insulating film in the second active region. And the method further includes the step of g) forming control gate electrodes over the second insulating film.

In one embodiment of the present invention, at least one of the first and second insulating films may be formed by a CVD process.

An inventive circuit for testing a nonvolatile semiconductor memory includes a serial connection of flash memory cells. Thus, the threshold voltage of a flash memory array can be estimated using a memory group that has the same channel structure as that of an actual device. Accordingly, the circuit can evaluate the performance of each cell in the flash memory array more accurately than a known test circuit. Where the circuit further includes a parallel connection of flash memory cells, it is possible to estimate both a threshold voltage reflecting the highest threshold voltage of one of the cells in the memory array and a threshold voltage reflecting the lowest threshold voltage of one of the cells in the memory array.

Another inventive nonvolatile semiconductor memory includes a test circuit, in which the capacitive insulating film of each of the flash memory cells is thicker than the capacitive insulating film of each of the cells in the flash memory array under test. Thus, electrons are less likely exchanged through the capacitive insulating film in the test circuit. Accordingly, a characteristic of a particular cell (specifically, the charge retention characteristic of a tunnel insulating film) in the flash memory array can be evaluated more accurately.

Thus, according to the present invention, the performance of a particular cell in the flash memory array under test can be evaluated more accurately. As a result, the design and fabrication processes of a nonvolatile semiconductor memory can be improved and optimized more rapidly and more appropriately compared to the prior art. In addition, a highly reliable memory can be developed in a shorter cycle time.

DESCRIPTION OF THE PREFERRED EMBODIMENTS

Figure 1:
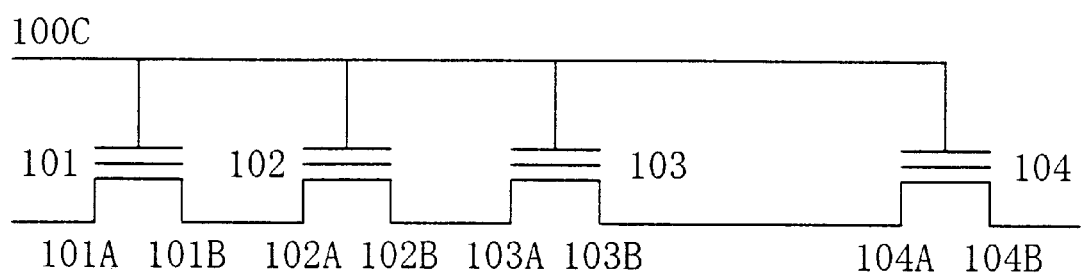
FIG. 1 schematically illustrates a structure for a serial connection of flash memory cells in accordance with a first embodiment of the present invention.

To make a test circuit that does not include a memory group with a channel structure different from that of an actual device, the present inventors hit upon the idea of making a test circuit with a group of memory cells that are connected in series with each other. Hereinafter, preferred embodiments of the present invention will be described with reference to the accompanying drawings, in which components with substantially the same function are identified by the same reference numeral for the sake of simplicity.

Embodiment 1

First, a circuit for testing a nonvolatile semiconductor S memory in accordance with a first embodiment of the present invention will be described with reference to FIGS. 1 through 4.

FIG. 1 schematically illustrates the structure of a circuit for testing a nonvolatile semiconductor memory in accordance with the first embodiment. The circuit includes a group of flash memory cells 101 through 104 (which will be herein referred to as a "flash memory group"). The gates of these flash memory cells are connected to a common gate 100C. The source (e.g., 101A, 102A, etc.) and drain (e.g., 101B, 102B, etc.) of two adjacent cells (e.g., 101 and 102) are connected to each other. That is to say, the test circuit shown in FIG. 1 includes a group of flash memory cells that are connected in series with each other. It should be noted that the number of memory cells for the memory group is not limited to four but may be determined appropriately according to the performance of a nonvolatile semiconductor memory under test. For example, the memory group may include approximately one hundred to one hundred thousand memory cells. Also, the term "flash memory" herein refers to any EEPROM/EPROM.

Figure 2:
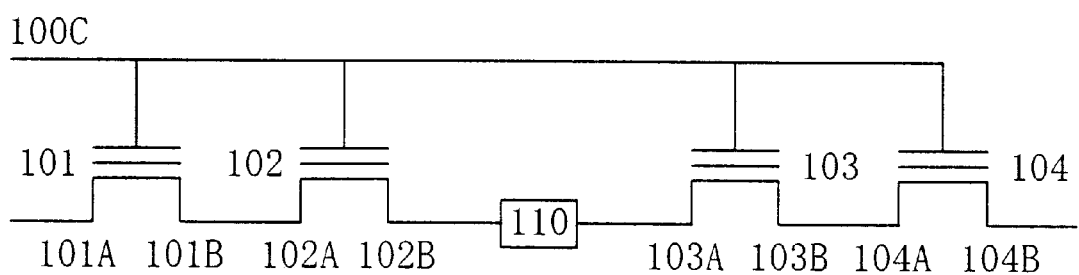
FIG. 2 schematically illustrates a structure for a serial connection of flash memory cells, which includes a current amplifier 110 or a voltage amplifier 110.

As shown in FIG. 2, the serial connection of flash memory cells may further include a current amplifier 110 or a voltage amplifier 110. If the current or voltage amplifier 110 is added, current or voltage, which has been decreased by the resistance of the memory cells, can be restored to its desired level. The ability or the number of the current or voltage amplifier 110 may be determined by the number of the memory cells because channel resistance per memory cell can be calculated relatively easily.

The test circuit shown in FIG. 1 or 2 includes a serial connection of flash memory cells as a test memory group and reflects the characteristic of one of the cells that has the highest threshold voltage. That is to say, since these cells are connected in series together, no current should flow through the memory group unless the voltage applied to the common gate 100C reaches the highest threshold voltage. Accordingly, if the test circuit shown in FIG. 1 or 2 is used, a memory array does not have to be tested by the known method anymore; a cell having the highest threshold voltage in an n-channel memory array does not have to be tested by using a cell having the lowest threshold voltage in a p-channel memory group. Accordingly, it is possible to test the cell having the highest threshold voltage using a test memory group in which each cell has the same channel and source/drain structures as those of an actual device under test.

Figure 3:
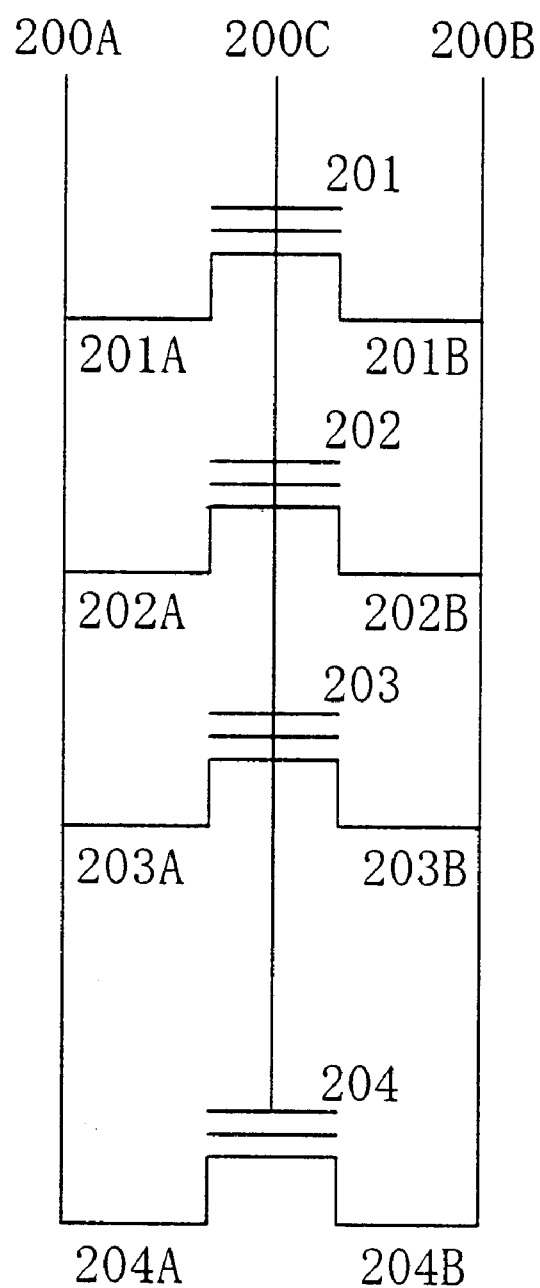
FIG. 3 schematically illustrates a structure for a group of flash memory cells that are connected in parallel with each other.
Figure 7:
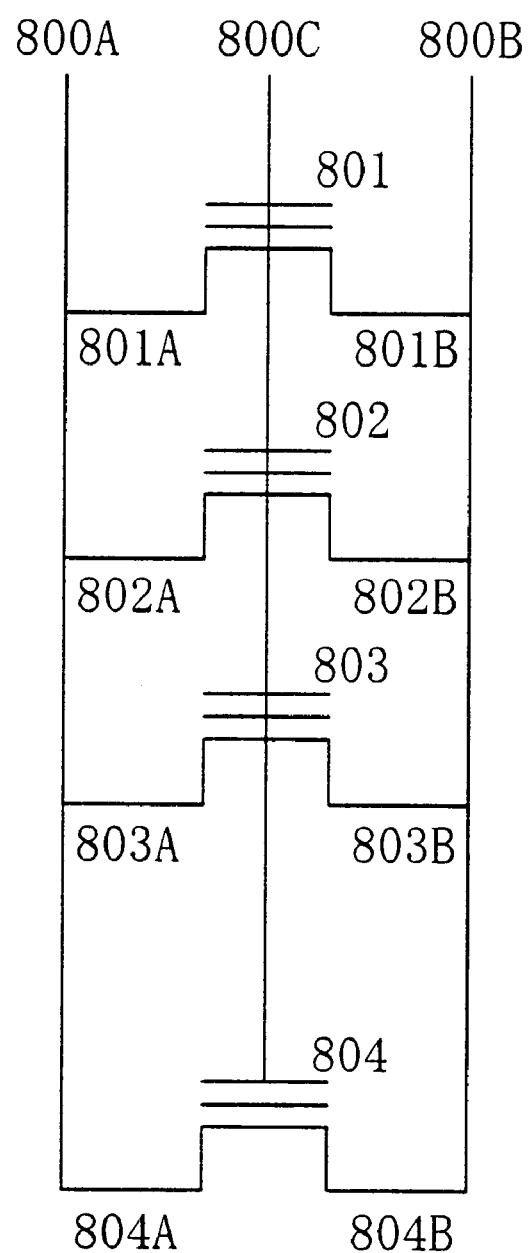
FIG. 7 illustrating a structure for a known circuit for testing a nonvolatile semiconductor memory.

FIG. 3 schematically illustrates the structure of a group of cells 201 through 204 that are connected in parallel with each other via common source 200A, common drain 200B and common gate 200C. By using a test circuit including both the parallel connection shown in FIG. 3 and the serial connection shown in FIG. 1 or 2, it is possible to test a cell having the highest or lowest threshold voltage by using one of the memory groups with the same channel and source/drain structures as those of the actual device under test. The structures of the memory groups shown in FIGS. 3 and 7 are substantially the same. It should be noted that, as in the serial connection, the number of memory cells for the parallel connection is not limited to four but may be determined appropriately according to the performance of a nonvolatile semiconductor memory under test.

Figure 4A:
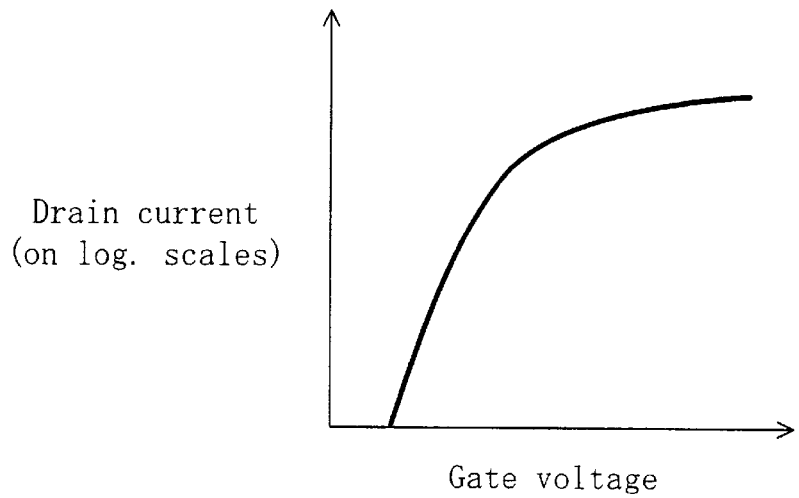
FIG. 4A is a graph illustrating the current-voltage curve of an ideal parallel connection of memory cells with a single and constant threshold voltage.
Figure 4B:
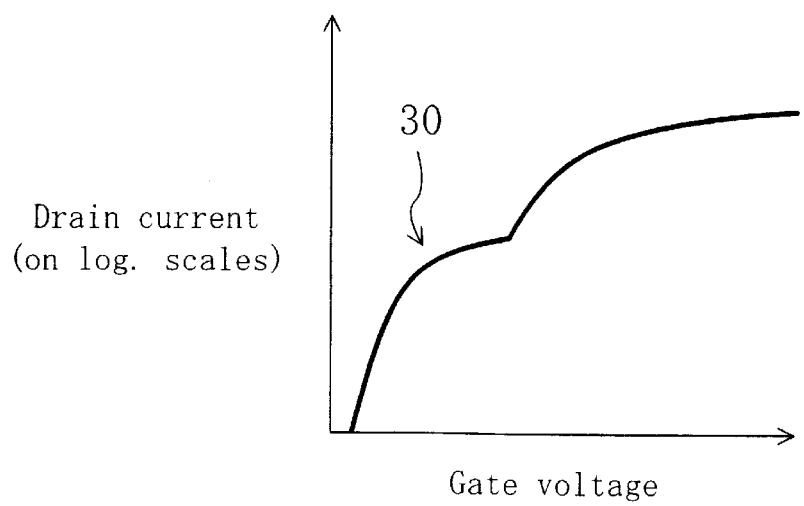
FIG. 4B is a graph illustrating the current-voltage curve of a parallel connection of memory cells, one of which has a noticeably low threshold voltage.

FIG. 4A is a graph illustrating the current-voltage curve where the threshold voltage of a cell was measured using a test circuit that includes the parallel connection tester shown in FIG. 3. Where the parallel connection tester is used, the drain current of the tester reflects the drain current flowing through one of the cells with the lowest threshold voltage in the tester so long as the gate voltage is relatively low. Thus, the lowest threshold voltage of a cell in the memory array can be estimated by measuring the threshold voltage of the parallel connection tester. For example, if a cell that has a noticeably low threshold voltage (abnormal cell) exists in the memory array, a hump 30 is observed in the range where the gate voltage is relatively low as shown in FIG. 4B. Thus, the existence of the abnormal cell is easily identifiable. However, using only the parallel connection tester shown in FIG. 3, the highest threshold voltage of a cell in the memory array cannot be estimated. The drain current flowing through the cell with the highest threshold voltage is associated with a relatively high gate voltage. However, such drain current cannot be identified from the other drain currents flowing through the other cells.

The cell with the highest threshold voltage can be tested using the serial connection tester shown in FIG. 1 or 2. In the serial connection tester, the cells are connected in series with each other. Therefore, if one of the cells in the tester is discontinuous, the drain current does not flow through the tester. Thus, the threshold voltage of the serial connection tester reflects the highest threshold voltage of a cell in the memory array. For this reason, the highest threshold voltage of the cell in the memory array can be estimated by measuring the threshold voltage of the test circuit including the serial connection tester.

Figure 5A:
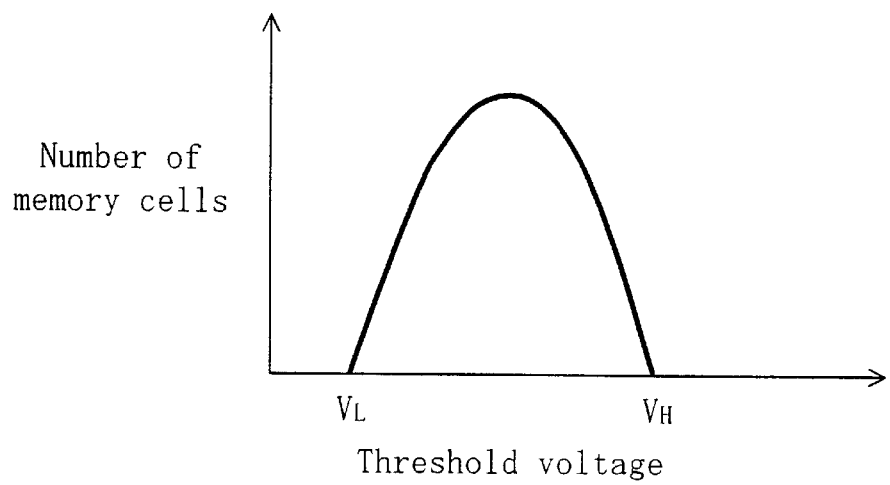
FIG. 5A is a graph illustrating the threshold voltage distribution of cells in a memory array.

FIG. 5A is a graph illustrating the threshold voltage distribution of the cells in a memory array. When the threshold voltage of the memory array with this distribution is estimated using the test circuit of this embodiment, the current-voltage curve will be, for example, as shown in FIG. 5B.

Figure 5B:
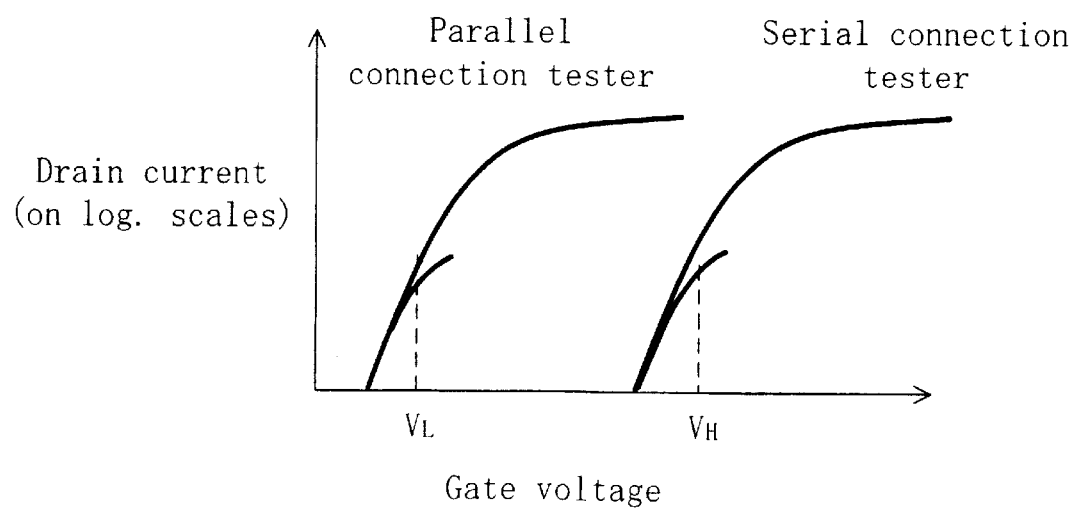
FIG. 5B is a graph illustrating current-voltage curves for describing how the threshold voltages of memory cells can be estimated by using a parallel connection tester a serial connection tester.

As shown in FIG. 5B, a threshold voltage $V_L$ reflecting the lowest threshold voltage of a cell in the memory array can be estimated by using the test circuit with the parallel connection tester. On the other hand, a threshold voltage $V_H$ reflecting the highest threshold voltage of a cell in the memory array can be estimated by using the test circuit with the serial connection tester. Furthermore, the threshold voltage distribution range of cells being written or erased may also be estimated by the difference between the threshold voltages $V_L$ and $V_H$ obtained by using the parallel and serial connection testers, respectively. Also, by performing the threshold voltage estimation during the fabrication process of the memory array, it is possible to know the threshold voltage distribution range of the cells in the memory group during the fabrication process and the degree of the charge buildup.

For reference purposes, the short curves on the graph in FIG. 5B respectively illustrate the drain current characteristic of a cell that has the lowest threshold voltage in the memory cell group (which was estimated using the parallel connection tester) and the drain current characteristic of a cell that has the highest threshold voltage in the memory cell group (which was estimated using the serial connection tester). By reference to this graph, the following points can be understood. In the parallel connection tester, current flows from the cell with the lowest threshold voltage through the whole circuit. On the other hand, in the serial connection tester, while the cell with the highest threshold voltage is OFF, no drain current flows. However, when the cell with the highest threshold voltage turns ON, the drain current flows throughout the whole test circuit.

Further, if the threshold voltages $V_L$ and $V_H$ estimated by the test circuit of this embodiment fall within a predetermined range, a nonvolatile semiconductor memory including the test circuit can be regarded as a GO. Otherwise, the nonvolatile semiconductor memory can be regarded as a NO-GO. One or more test circuit(s) of this embodiment may be disposed on a semiconductor wafer and all nonvolatile semiconductor memories on the wafer may be judged as GOs or NO-GOs by using the test circuit(s). Or each nonvolatile semiconductor memory may be provided with at least one test circuit and judged as a GO or NO-GO by using the test circuit. To carry out a reliability test on a great number of memories in a short time, the following method may be used; the test may be conducted at one or more sites on the wafer by using the test circuit of this embodiment and if the nonvolatile semiconductor memories are judged as NO-GOs, the wafer may be discarded.

In the serial connection tester shown in FIG. 1 or 2, the cells are arranged in such a manner that the source of a cell is connected to the drain of an adjacent cell. Specifically, the source of a cell (e.g., the source 102A of the cell 102) is connected to the drain of an adjacent cell (e.g., the drain 101B of the cell 101) and the drain of a cell (e.g., the drain 102B of the cell 102) is connected to the source of an adjacent cell (e.g., the source 103A of the cell 103). However, the cells do not have to be arranged in this manner. Specifically, the cells may be arranged in such a manner that the source of a cell is shared with an adjacent cell and that the drain of a cell is shared with an adjacent cell. Also, the serial and parallel connection testers should be made of cells of the same type to accurately estimate the loss of positive and negative charges stored under the same accelerated condition.

If the serial and parallel connection testers are both disposed on a semiconductor wafer, it is possible to test two cells that have the highest and lowest threshold voltages respectively. However, if at least the serial connection tester is prepared, the following advantage can be obtained: the maximum threshold voltage of the cells in the memory array can be estimated by using the test circuit of the same channel type as that of an actual device under test. Also, in the foregoing embodiment, the device under test is supposed to be an n-channel memory cell. If the device under test is of p-channel type, the cell with the highest threshold voltage in the memory array can be tested by using the parallel connection tester, and the cell with the lowest threshold voltage in the memory array can be tested by using the serial connection tester.

Moreover, the test circuit of this embodiment may be left in a special environment to estimate, at regular intervals, the threshold voltages $V_H$ and $V_L$ of the serial and parallel connection testers included in the test circuit. By making this estimation, it is possible to estimate how the threshold voltage distribution of cells changes in a memory array. The test circuit of this embodiment includes a memory group in which each cell has the same channel and source/drain structures as those of an actual device. Therefore, the test circuit can carry out the estimation more accurately than a known test circuit including a memory group with a different channel structure. The special environment herein refers to, for example, an environment where the loss or injection of charges from/into a flash memory is accelerated. In such an environment, the estimations may be made at regular intervals using the serial and parallel connection testers.

Examples of the environments where the loss of charges from a flash memory is accelerated include an environment where the threshold voltage of a memory group is set higher (e.g., to 9 V) than the threshold voltage (e.g., 5 V) of a nonvolatile semiconductor memory in its operating range. If the test circuit is left in this environment, a much greater quantity of electrons are injected into the tunnel oxide film of each cell as compared to a situation where the threshold voltage is set to the high value (e.g., 5 V) in the normal operating range. Therefore, a high electric field is placed on the tunnel oxide film to allow electrons to be lost more easily. Thus, the threshold voltage of the cells under such an excessive stress changes more greatly than that of cells having a threshold voltage in the normal operating range. As a result, it is possible to evaluate the charge retention characteristic of the memory cells in a shorter time. In such an environment, if the variations in the highest and lowest threshold voltages of cells in a memory array are estimated using the test circuit of this embodiment, the reliability of a great number of cells can be evaluated more easily.

Also, the test circuit may be left in an environment where the threshold voltage of a memory group is set lower than the threshold voltage of a nonvolatile semiconductor memory in its operating range. In the environment where the threshold voltage of the memory group is set lower (e.g., −2 V) than the low threshold voltage (e.g., 2 V) in the normal operating range, a much greater quantity of electrons have been lost from the tunnel oxide film. Thus, a high electric field is placed on the tunnel oxide film, thereby allowing electrons to be injected into the tunnel oxide film more easily. In this case, the threshold voltage of the cells under the stress changes more greatly than that of cells in the normal operating range as in the environment where the threshold voltage of the memory group is set higher than the high threshold voltage of the nonvolatile semiconductor memory in its operating range. As a result, it is possible to evaluate the charge retention characteristic of the memory cells in a shorter time. And it is also possible to evaluate the reliability of a huge number of cells more easily.

Further, the test circuit may be left in an environment where a voltage such as the operating voltage of a nonvolatile semiconductor memory is applied to at least one of the gate, drain, source and semiconductor wafer of a memory group (for example, a voltage of −9 V may be applied to the gate). In this environment, electrons are also more likely exchanged in the memory cells. Therefore, it is possible to evaluate the reliability of the cells in a shorter time by estimating the variations in the highest and lowest threshold voltages of cells in the memory group.

Moreover, the test circuit of this embodiment may be left in an environment (at a particular temperature, e.g., 250° C.). In such an environment, electrons are also more likely exchanged in the memory cells. Therefore, it is possible to evaluate the reliability of the cells in a shorter time by estimating the variations in the highest and lowest threshold voltages of cells in the memory group. In addition, it is also possible to evaluate the reliability of a nonvolatile semiconductor memory operating at the particular temperature.

Embodiment 2

Hereinafter, a second embodiment of the present invention will be described with reference to FIGS. 6A through 6H. As shown in FIG. 6H, a tester 513 for testing a nonvolatile semiconductor memory in accordance with this embodiment includes: tunnel gate insulating (e.g., oxide) film 503 formed on a semiconductor (e.g., silicon) substrate 501; floating gate electrode 505 formed on the tunnel insulating film 503; capacitive insulating film 510 which covers the surface of the floating gate electrode 505; and control gate electrode 511 that has been formed over the semiconductor substrate 501 to cover the capacitive insulating film 510. The tunnel gate insulating film 503 will be herein referred to as a "tunnel insulating film" simply. The capacitive insulating film 510 of the tester 513 of this embodiment is formed to be thicker than the capacitive insulating film 509 of a nonvolatile semiconductor memory 512 under test.

The tester 513 and the nonvolatile semiconductor memory 512 are mounted on the same semiconductor substrate 501. The nonvolatile semiconductor memory 512 also includes, the tunnel insulating film 503, floating gate electrode 505, capacitive insulating film 509, and control gate electrode 511. The illustrated tester 513 is equivalent to one of the memory cells (e.g., cells 101 through 104 and 201 through 204) of the first embodiment.

The capacitive insulating film 510 (for example, silicon dioxide film with a thickness of 30 nm) of the tester 513 is thicker than the capacitive insulating film 509 (for example, silicon dioxide film with a thickness of 20 nm) of the nonvolatile semiconductor memory 512. Accordingly, even if the tester 513 is placed in an environment where the loss or injection of charges from/into a flash memory is accelerated, electrons are less likely exchanged through the capacitive insulating film 510. Therefore, in an accelerated test conducted in such an environment, only the exchange of electrons through the tunnel insulating film 503 can be estimated using the tester 513. Thus, the reliability of the tunnel insulating film 503 can be evaluated more accurately. In this embodiment, the capacitive insulating film 509 is deposited to a thickness of 20 nm. On the other hand, the capacitive insulating film 510 is deposited to a thickness of 30 nm. However, the capacitive insulating film 510 does not have to be deposited to this thickness but may be deposited to any other appropriate thickness. For example, the capacitive insulating film 510 may be thicker than the capacitive insulating film 509 by about 20 to 200%.

The capacitive insulating film 510 of the tester 513 has a thickness different from that of the capacitive insulating film 509 of the nonvolatile semiconductor memory 512. However, the width, height, or channel width of the floating gate electrode 505 of the tester 513 may also be different from that of the floating gate electrode 505 of the nonvolatile semiconductor memory 512. Then, the ratio of the capacitance of the floating gate electrode 505 to that of the tunnel oxide film 503 in the memory cell of the tester 513 can be equalized with the ratio of the capacitance of the floating gate electrode 505 to that of the tunnel oxide film 503 in the memory cell of the nonvolatile semiconductor memory 512. In such a structure, even though the thicknesses of the capacitive insulating films 509 and 510 are different from each other, the reliability of the tunnel insulating film 503 can be evaluated more accurately by applying a voltage to the control gate electrode 511, for example.

Moreover, by fabricating the memory cells of the tester 513 and the nonvolatile semiconductor memory 512 in such a manner that the respective channel regions thereof have the same shape, the effect of the channel shape on the reliability of the tunnel oxide film 503 can be evaluated more accurately.

Hereinafter, a method for fabricating the tester 513 of this embodiment will be described with reference to FIGS. 6A through 6H. FIGS. 6A through 6H are cross-sectional views corresponding to respective process steps for fabricating the tester 513.

Figure 6A:
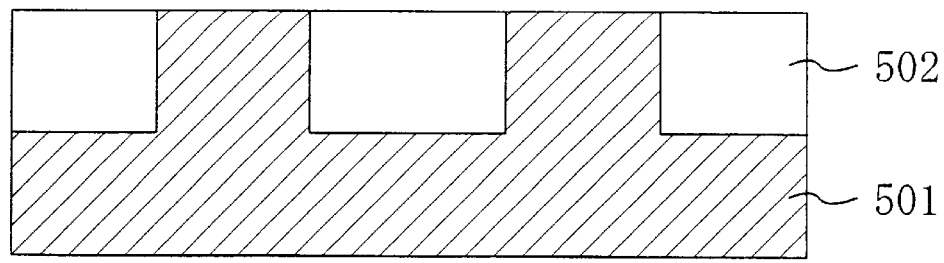
FIGS. 6A through 6H are cross-sectional views illustrating respective process steps for fabricating a nonvolatile semiconductor memory in accordance with a second embodiment of the present invention.

First, as shown in FIG. 6A, isolation regions 502 of silicon dioxide are selectively defined in the silicon substrate 501, thereby defining two or more active regions that are electrically isolated from each other by the isolation regions 502.

Figure 6B:
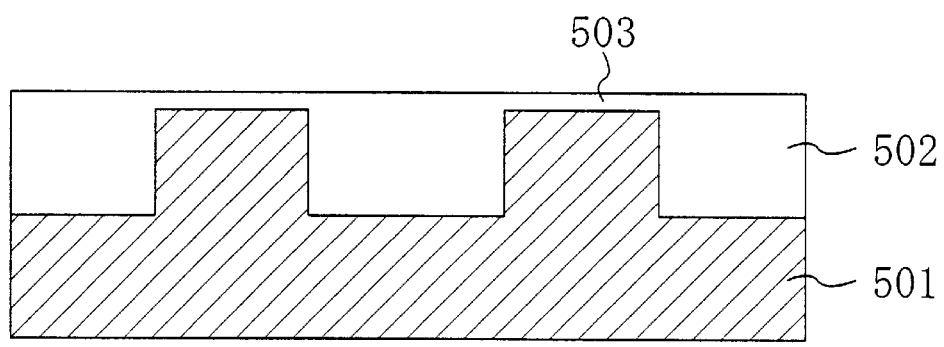

Then, as shown in FIG. 6B, a silicon dioxide film to be the tunnel insulting film 503 is formed by thermal oxidation to have a thickness of 10 nm on the silicon substrate 501.

Figure 6C:
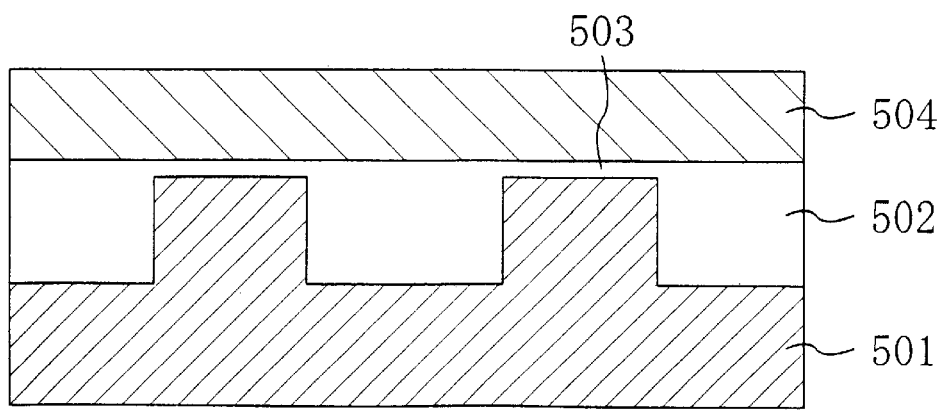

Subsequently, as shown in FIG. 6C, a silicon film containing $P^+$ ions as a dopant is deposited to a thickness of 250 nm over the silicon substrate 501 to form a first conductive film 504.

Figure 6D:
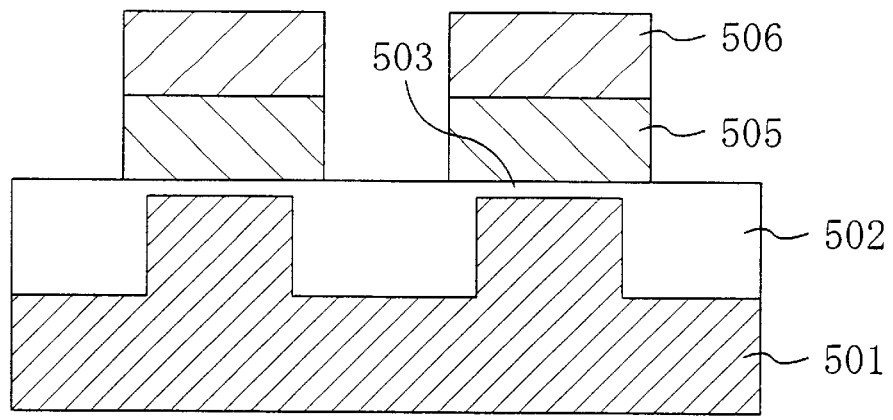

Next, as shown in FIG. 6D, parts of the first conductive film 504 are selectively dry-etched away using, as a mask, a photoresist 506 for defining the shape of floating gate electrodes, thereby forming the floating gate electrodes 505.

Figure 6E:
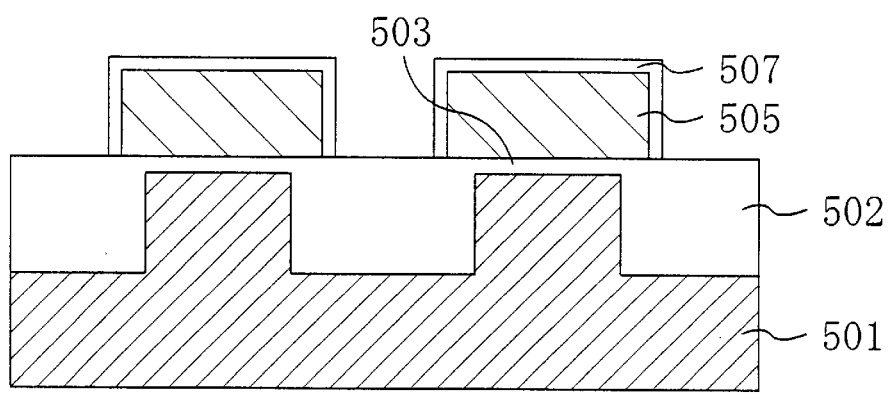

Then, as shown in FIG. 6E, a silicon dioxide film is deposited by a CVD process as a first insulating film 507 to a thickness of 10 nm over the substrate including the surface of the floating gate electrodes 505.

Figure 6F:
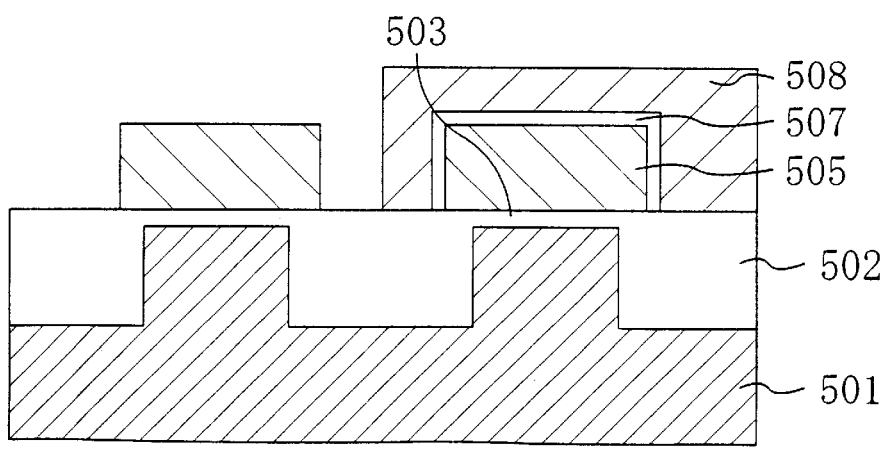

Subsequently, as shown in FIG. 6F, a photoresist 508 is formed to cover the floating gate 505 to be the memory cell of the tester 513. Thereafter, part of the first insulating film 507 is selectively dry- or wet-etched away using the photoresist 508 as a mask and then the photoresist 508 is removed.

Figure 6G:
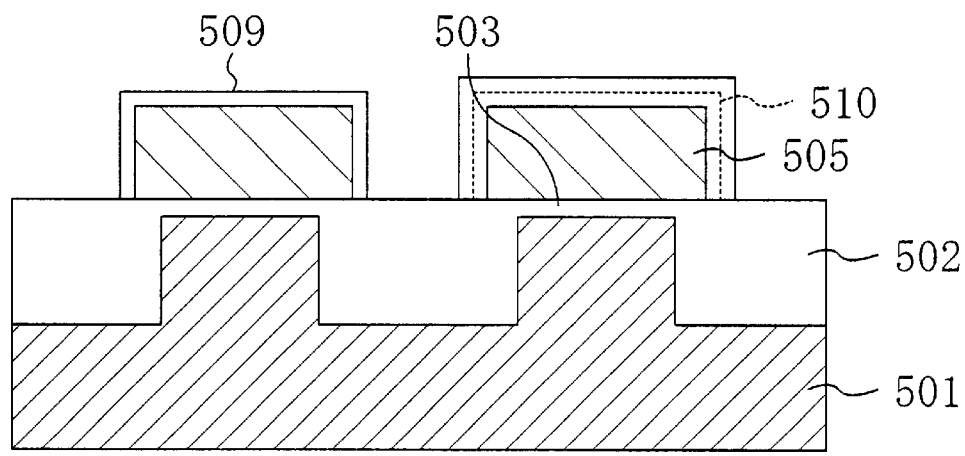
Figure 6H:
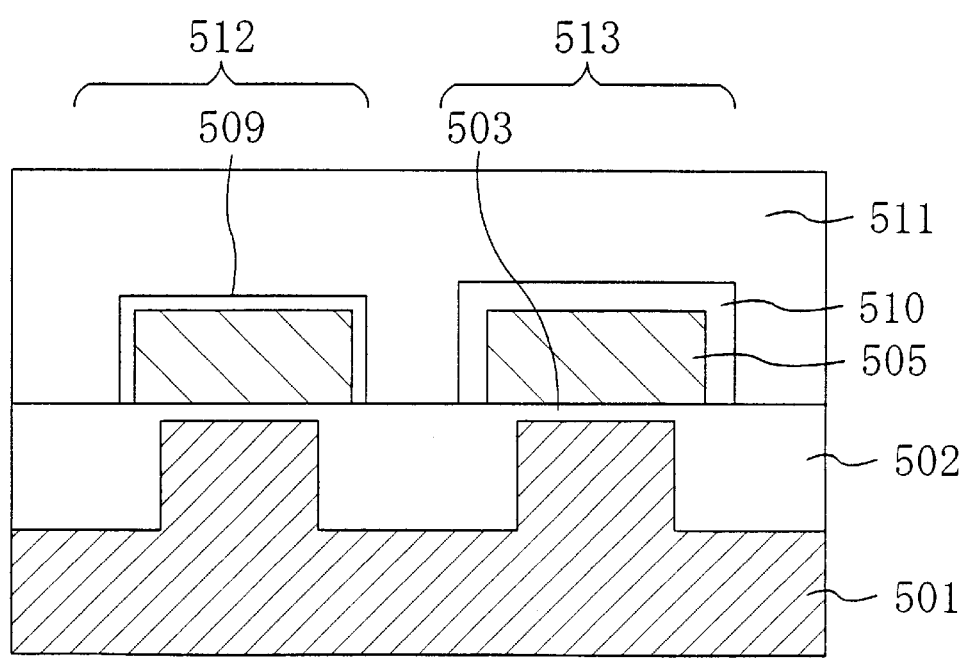

Next, as shown in FIG. 6G, a silicon dioxide film to be the first capacitive insulating film 509 is deposited by a CVD process to a thickness of 20 nm. The second capacitive insulating film 510 thicker than the first capacitive film 509 is also formed in this process step.

Next, as shown in FIG. 6H, a polysilicon film is deposited as a second conductive film 511 to a thickness of 250 nm. Finally, to pattern the stripped structure extending in the bit line direction (i.e., the direction coming out of the paper) into respective cell structures, a photoresist mask (not shown) for determining the shapes of cells is defined on the second conductive film 511. Then, the second conductive film 511, floating gate electrodes 505, and first and second capacitive insulating films 509 and 510 are selectively dry-etched away using the photoresist mask, thereby forming the nonvolatile semiconductor memory (memory cell) 512 and the tester (memory cell) 513.

By performing this method, a normal nonvolatile semiconductor memory 512 including the first capacitive insulating film 509 and its tester 513 including the second capacitive insulating film 510 thicker than the first capacitive insulating film 509 can be formed on the same semiconductor substrate 501. In the method of this embodiment, the first insulating film 507 is deposited by a CVD process. Therefore, the thickness of the floating gate electrodes 505 can be kept unchanged and the grain growth can be suppressed in the floating gate electrodes 505. For this reason, it is possible to provide a tester realizing higher reliability. It should be noted that the first capacitive insulating film 509 is made of silicon dioxide in this embodiment but may be implemented as a multilayer structure of silicon dioxide, silicon nitride and silicon dioxide films.

What is claimed is:

1. A circuit for testing a nonvolatile semiconductor memory, the circuit comprising a serial connection of flash memory cells as a first memory group,
    wherein the gates of the serially connected flash memory cells have been connected to each other and
    wherein a first one of the cells has its source or drain connected to the source or drain of a second one of the cells when the first and second cells are adjacent to each other.

2. The circuit of claim 1, further comprising a parallel connection of flash memory cells as a second memory group,
    wherein the sources of the cells have been connected together, the drains of the cells have also been connected together and the gates of the cells have also been connected together.

3. The circuit of claim 2, wherein each of the flash memory cells in the serial connection has the same structure as each of the flash memory cells in the parallel connection.

4. The circuit of claim 2, wherein the serial connection further comprises a current amplifier or a voltage amplifier.

5. The circuit of claim 1, wherein the gates of the flash memory cells have been connected to a common gate line.

6. A method for testing a nonvolatile semiconductor memory using a test circuit, the method comprising the steps of:

a) preparing the test circuit, the circuit including a serial connection of flash memory cells and a parallel connection of flash memory cells, wherein in the serial connection, the gates of the flash memory cells have been connected to each other, and a first one of the cells has its source or drain connected to the source or drain of a second one of the cells when the first and second cells are adjacent to each other, and wherein in the parallel connection, the sources of the cells have been connected together, the drains of the cells have also been connected together and the gates of the cells have also been connected together;

b) evaluating a characteristic of one of the flash memory cells that has the highest threshold voltage in the serial connection included in the test circuit; and c) evaluating a characteristic of one of the flash memory cells that has the lowest threshold voltage in the parallel connection included in the test circuit.

7. The method of claim 6, wherein the steps b) and c) are performed at regular intervals in an environment where loss or injection of retained charges from/into each of the flash memory cells is accelerated.

8. The method of claim 5, wherein in the environment, each of the flash memory cells belonging to the serial connection has its threshold voltage set higher than a threshold voltage of the nonvolatile semiconductor memory in an operating range thereof.

9. The method of claim 5, wherein in the environment, each of the flash memory cells belonging to the parallel connection has its threshold voltage set lower than a threshold voltage of the nonvolatile semiconductor memory in an operating range thereof.

10. The method of claim 5, wherein in the environment, a voltage accelerating the loss or injection of the retained charges is applied to at least one of the gate, drain, source and substrate in each of the cells belonging to the serial or parallel connection.

11. The method of claim 5, wherein the temperature of the environment is set to a temperature at which the nonvolatile semiconductor memory is tested to accelerate the loss or injection of the retained charges.

12. A nonvolatile semiconductor memory comprising:

a circuit for testing the nonvolatile semiconductor memory; and an array of flash memory cells, wherein the circuit includes: a serial connection of flash memory cells; and a parallel connection of flash memory cells, and wherein in the serial connection, the gates of the flash memory cells have been connected to each other, and a first one of the cells has its source or drain connected to the source or drain of a second one of the cells when the first and second cells are adjacent to each other, and wherein in the parallel connection, the sources of the cells have been connected together, the drains of the cells have also been connected together and the gates of the cells have also been connected together, and wherein each of the flash memory cells in the circuit and each of the flash memory cells in the array include a tunnel insulating film, a floating gate electrode, a capacitive insulating film and a control gate electrode, and wherein the capacitive insulating film of each of the flash memory cells in the circuit is thicker than the capacitive insulating film of each of the flash memory cells in the array.

13. The memory of claim 12, wherein a ratio of the capacitance of the floating gate electrode to the capacitance of the tunnel insulating film in each of the flash memory cells of the array is equal to a ratio of the capacitance of the floating gate electrode to the capacitance of the tunnel insulating film in each of the flash memory cells of the circuit.

14. The memory of claim 12, wherein the channel region of each of the flash memory cells in the array has the same shape as the channel region of each of the flash memory cells in the circuit.

* * * * *